US006841851B2

United States Patent
Jung

(10) Patent No.: US 6,841,851 B2
(45) Date of Patent: Jan. 11, 2005

(54) SEMICONDUCTOR DEVICE HAVING A HIGH DENSITY PLASMA OXIDE LAYER

(75) Inventor: Woo-chan Jung, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 23 days.

(21) Appl. No.: 10/448,366

(22) Filed: May 30, 2003

(65) Prior Publication Data

US 2003/0205784 A1 Nov. 6, 2003

Related U.S. Application Data

(62) Division of application No. 10/206,197, filed on Jul. 29, 2002, now Pat. No. 6,599,792.

(30) Foreign Application Priority Data

Aug. 7, 2001 (KR) ............................................. 01-47456

(51) Int. Cl.$^7$ ............................................. H01L 23/58
(52) U.S. Cl. ....................................................... 257/640
(58) Field of Search ........................... 257/632, 635–640; 438/618, 769, 724

(56) References Cited

U.S. PATENT DOCUMENTS 6,156,636 A    12/2000   Yeom et al.
6,165,880 A  * 12/2000   Yaung et al. ................ 438/592
6,218,715 B1    4/2001   Kim et al.
6,323,103 B1   11/2001   Rengarajan et al.
6,420,250 B1    7/2002   Cho et al.
6,465,310 B2   10/2002   Lee et al.
6,500,678 B1   12/2002   Aggarwal et al.

FOREIGN PATENT DOCUMENTS

JP          11-097529        4/1999

* cited by examiner

Primary Examiner—Chandra Chaudhari
(74) Attorney, Agent, or Firm—Lee & Sterba, P.C.

(57) ABSTRACT

A semiconductor device and a method for manufacturing the same, wherein a gate electrode structure is formed on a surface of a semiconductor substrate. Next, a gate poly oxide (GPOX) layer is deposited on a surface of the gate electrode structure and on the semiconductor substrate. Then, the surface of the semiconductor substrate is cleaned to remove any residue and the GPOX layer remaining on the semiconductor substrate. Next, an etch stopper is formed on the surface of the gate electrode structure and on the semiconductor substrate. Last, a high-density plasma (HDP) oxide layer is deposited on the etch stopper. The semiconductor device and method for manufacturing the same are capable of preventing bubble defects.

8 Claims, 8 Drawing Sheets

SEMICONDUCTOR DEVICE HAVING A HIGH DENSITY PLASMA OXIDE LAYER

This application is a DIVISION of application Ser. No. 10/206,197, filed on Jul. 29, 2002, now U.S. Pat. No. 6,599,792.

BACKGROUND OF THE INVENTION

1. Field of the Invention

The present invention relates to a semiconductor device and a method for manufacturing the same. More particularly, the present invention relates to a semiconductor device and a method for manufacturing the same, which is capable of reducing bubble defects.

2. Description of the Related Art

In general, a high-density plasma (HDP) oxide layer having a high step coverage property is used primarily as an insulating layer for filling gaps between patterns. Since a high temperature flow process is not required for the HDP oxide layer after deposition, the HDP oxide layer has been used as an interlayer dielectric (ILD) film.

FIG. 1 illustrates a sectional view of a semiconductor device in which a HDP oxide layer is used as an ILD film for filling a gap between gate electrodes.

Referring to FIG. 1, a gate insulating layer 12, a doped polysilicon layer 14, a metal silicide layer 16, and a capping insulating layer 18, are sequentially stacked on a semiconductor substrate 10. Next, a portion of the capping insulating layer 18, a portion of the metal silicide layer 16, and a portion of the doped polysilicon layer 14 are patterned.

A spacer 20 is formed by a well-known method on both sidewalls of the patterned capping insulating layer 18, the patterned metal silicide layer 16, and the patterned doped polysilicon layer 14, thereby forming a gate electrode structure 22 including the gate insulating layer 12, the doped polysilicon layer 14, the metal silicide layer 16, the capping insulating layer 18, and the spacer 20.

A gate poly oxide (GPOX) layer 24 is deposited on the surface of the semiconductor substrate 10 on which the gate electrode structure 22 is formed. The GPOX layer 24 cures damage occurring in the patterning process for forming the gate electrode structure 22 by smoothing the edges of the gate electrode structure 22 and the surface of the semiconductor substrate 10, thereby preventing electrostatic fields from being concentrated on the edges of the gate electrode structure 22.

Next, impurity ions are implanted into the semiconductor substrate 10 at both sides of the gate electrode structure 22, thereby forming a junction region 26. An etch stopper 28 formed of silicon nitride ($Si_3N_4$) is deposited on the surface of the GPOX layer 24. Next, a HDP oxide layer 30 is deposited as an interlayer dielectric ((ILD) film.

However, a conventional semiconductor device has the following problems. In general, lifting occurs at an interface between silicon oxide ($SiO_2$) and a lower material of silicon oxide ($SiO_2$), and at an interface between silicon oxide ($SiO_2$) and silicon nitride ($Si_3N_4$), when the HDP oxide layer is deposited on a structure on which thin layers of silicon oxide ($SiO_2$) and silicon nitride ($Si_3N_4$) are sequentially stacked. The interfacial lifting is referred to as bubble defects. When depositing the HDP oxide layer, the bubble defects are caused by a difference in stress between silicon oxide ($SiO_2$) and silicon nitride ($Si_3N_4$), or by outgassed hydrogen ions.

The bubble defects occur in the above-mentioned semiconductor device. That is, the HDP oxide layer 30 is formed on the semiconductor substrate 10 including a stack comprised of the GPOX layer 24 formed of silicon oxide ($SiO_2$) and the etch stopper 28 formed of silicon nitride ($Si_3N_4$), and thus, the bubble defects occur.

Due to the bubble defects occurring in the semiconductor device, the adhesive strength of the interfaces is lowered, particles occur in the lift, and electrical properties of the semiconductor device are degraded.

In order to prevent the bubble defects, a method for relatively increasing the thickness of either the GPOX layer 24 or the etch stopper 28 has been suggested. However, in this case, the spacing between the gate electrode structures 22 is reduced, and thus a gap fill margin of the HDP layer 30 is reduced. Accordingly, the stress between the GPOX layer 24 and the etch stopper 28 is reduced.

SUMMARY OF THE INVENTION

In an effort to solve the above problem, it is a first feature of an embodiment of the present invention to provide a semiconductor device capable of reducing bubble defects in a gate electrode structure without reducing a gap fill margin of an interlayer dielectric (ILD) film.

It is a second feature of an embodiment of the present invention to provide a method for manufacturing a semiconductor device capable of reducing bubble defects.

Accordingly, to provide the first feature, according to one aspect of the present invention, there is provided a method for manufacturing a semiconductor device. In the method, a gate electrode structure is formed on a surface of a semiconductor substrate. A gate poly oxide (GPOX) layer is deposited on a surface of the gate electrode structure and on the semiconductor substrate. The surface of the semiconductor substrate is cleaned to remove any residue and the GPOX layer. An etch stopper is formed on the surface of the gate electrode structure and on the semiconductor substrate. A high-density plasma (HDP) oxide layer is deposited on the etch stopper.

The semiconductor substrate may be cleaned using a solution in which a buffer oxide etchant (BOE) ($HF+NH_4F$) solution is mixed with a standard cleaning 1 (SC1) ($NH_4OH+H_2O_2+H_2O$) solution. Pre-processing the surface of the semiconductor substrate using a high temperature sulfuric acid solution may be further performed after forming the gate electrode structure and before cleaning the surface of the semiconductor substrate.

A preferred formation of the gate electrode structure will now be described. In the preferred formation, a gate insulating layer, a conductive layer, and a capping insulating layer are sequentially formed on the semiconductor substrate. The capping insulating layer and the conductive layer are patterned. A spacer is formed on both sidewalls of the capping insulating layer and the conductive layer. In this case, after patterning the capping insulating layer and the conductive layer and before forming the spacer on both sidewalls of the capping insulating layer and the conductive layer, low concentration impurity ions are implanted into the semiconductor substrate at both sides of the patterned capping insulating layer and the patterned conductive layer. In addition, after forming the spacer, high concentration impurity ions are implanted into the semiconductor substrate at both sides of the spacer.

Further, after patterning the capping insulating layer and the conductive layer and before implanting low concentration impurity ions into the semiconductor substrate, an intermediate GPOX layer is additionally formed on the surface of the semiconductor substrate and on the surface of the conductive layer. The intermediate GPOX layer additionally formed is formed by a thermal oxidation method.

To provide the first feature, according to another aspect of the present invention, there is provided a method for manufacturing a semiconductor device.

A gate electrode structure is formed on a surface of a semiconductor substrate. An etch stopper is formed on the surface of the gate electrode structure and on the semiconductor substrate. A high-density plasma (HDP) oxide layer is deposited on the etch stopper.

After forming the gate electrode structure and before forming the etch stopper, the surface of the semiconductor substrate may be cleaned.

To provide the second feature, there is provided a semiconductor device. The semiconductor device includes a semiconductor substrate, a gate electrode structure formed on the semiconductor substrate, an etch stopper covering the semiconductor substrate and a surface of the gate electrode structure, and a high-density plasma (HDP) oxide layer formed on the etch stopper.

BRIEF DESCRIPTION OF THE DRAWINGS

The above and other features and advantages of the present invention will become more apparent to those of ordinary skill in the art upon review of a detailed description of preferred embodiments thereof with reference to the attached drawings in which.

DETAILED DESCRIPTION OF THE INVENTION

Figure 1:
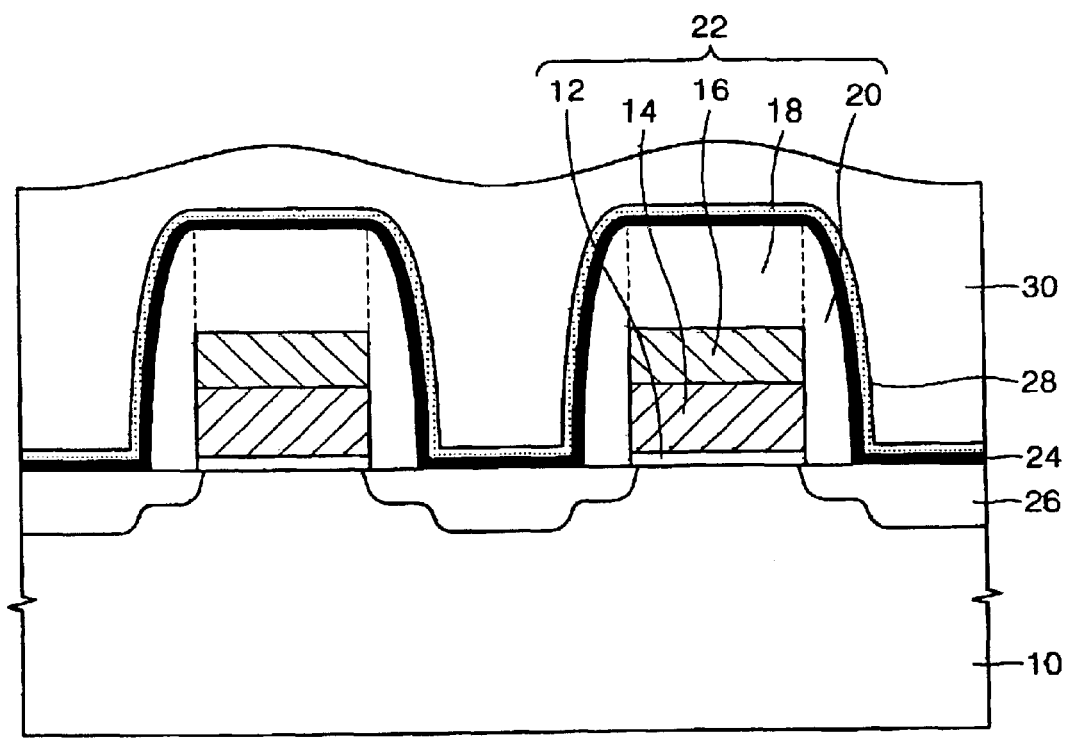
FIG. 1 illustrates a schematic sectional view of a conventional semiconductor device.

Korean Patent Application No. 2001-47456, filed Aug. 7, 2001, and entitled: "Semiconductor Device and Method for Manufacturing the Same," is incorporated by reference herein in its entirety.

The present invention will be described more fully hereinafter with reference to the accompanying drawings in which preferred embodiments of the invention are shown. This invention may, however, be embodied in many different forms and should not be construed as being limited to the embodiments set forth herein. Rather, these embodiments are provided so that this disclosure will be through and complete, and will fully convey the scope of the invention to those skilled in the art. In the drawings, the forms of elements are exaggerated for clarity. Like reference numerals refer to like elements throughout the drawings.

(Embodiment 1)

Figure 2A:
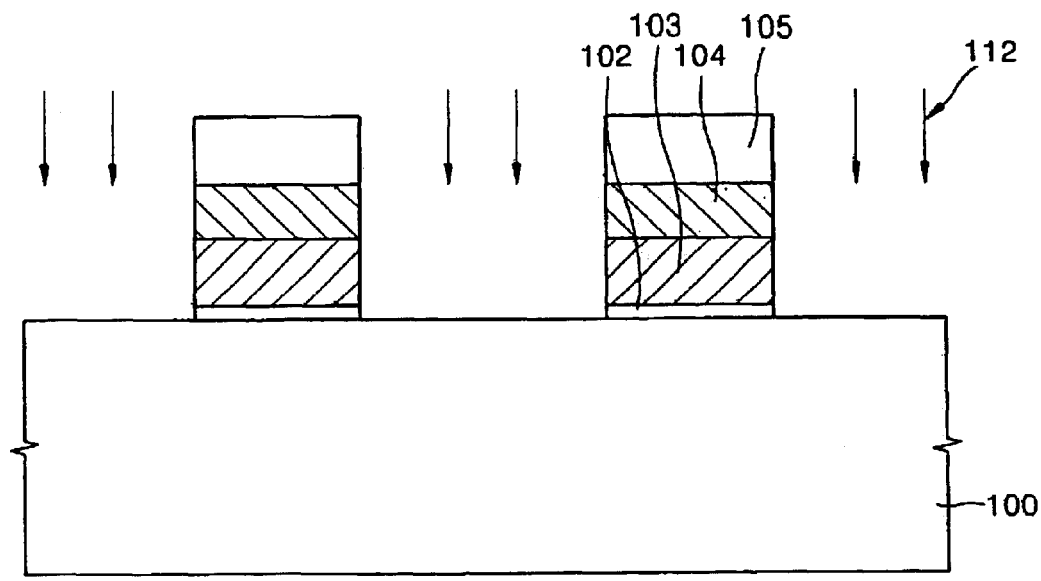
FIGS. 2A through 2D and FIG. 3 illustrate sectional views of processes according to a first embodiment of the present invention.

FIGS. 2A through 2D and FIG. 3 illustrate sectional views of processes according to a first embodiment of the present invention. Referring to FIG. 2A, a gate insulating layer 102, a doped polysilicon layer 103, a metal silicide layer 104, and a capping insulating layer 105 are sequentially stacked on a semiconductor substrate 100. The doped polysilicon layer 103 and the metal silicide layer 104 are used as a conductive layer of a gate electrode. The capping insulating layer 105 is formed of, for example, silicon nitride ($Si_3N_4$) or silicon oxynitride (SiON). A portion of the capping insulating layer 105, part of the metal silicide layer 104, and part of the doped polysilicon layer 103 are patterned. Next, low concentration impurity ions 112 are implanted into the semiconductor substrate 100 at both sides of the patterned capping insulating layer 105, the patterned metal silicide layer 104, and the patterned doped polysilicon layer 103 to form a junction region.

Figure 2B:
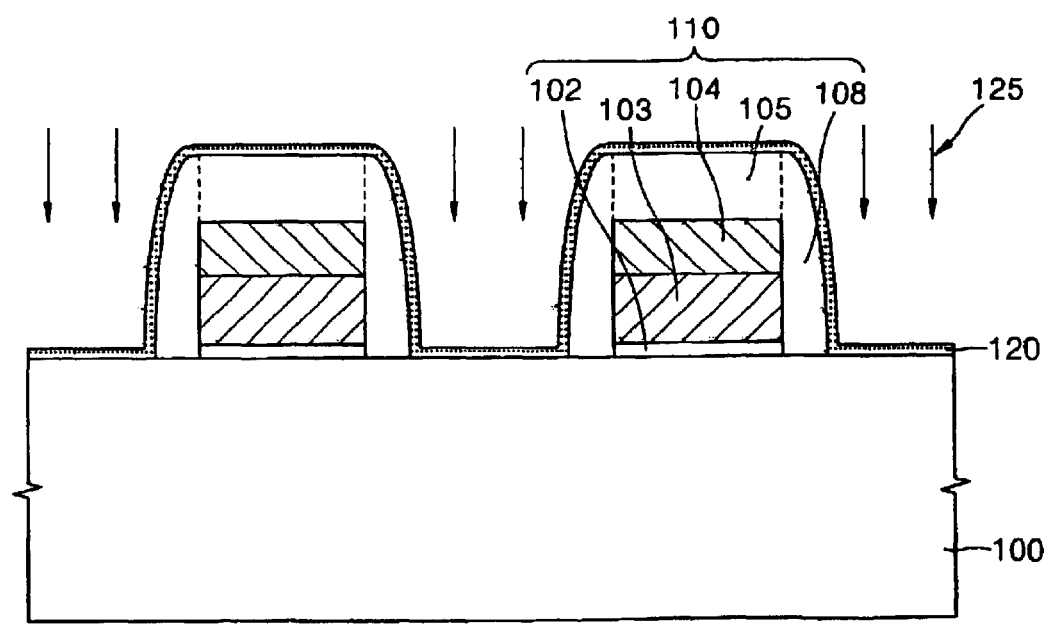

Referring to FIG. 2B, a spacer 108 is formed on both sidewalls of the patterned capping insulating layer 105, the patterned metal silicide layer 104, and the patterned doped polysilicon layer 103, by a well-known anisotropic blanket etching method. The spacer 108 is formed of the same material as the capping insulating layer 105. In the first embodiment, the structure including a stack including the gate insulating layer 102, the doped polysilicon layer 103, the metal silicide layer 104, and the capping insulating layer 105, and the spacer 108 formed on both sidewalls of the stack, is referred to as a gate electrode structure 110.

A gate poly oxide (GPOX) layer 120 is formed on the surface of the semiconductor substrate 100 on which the gate electrode structure 110 is formed. The GPOX layer 120 is formed to a thickness less than 100 Å, preferably, about 40–60 Å.

Next, high concentration impurity ions 125 are implanted into the semiconductor substrate 100 at both sides of the gate electrode structure 110. Since the GPOX layer 120 is formed on the surface of the semiconductor substrate 100, damage in the ion implantation process can be reduced.

Figure 2C:
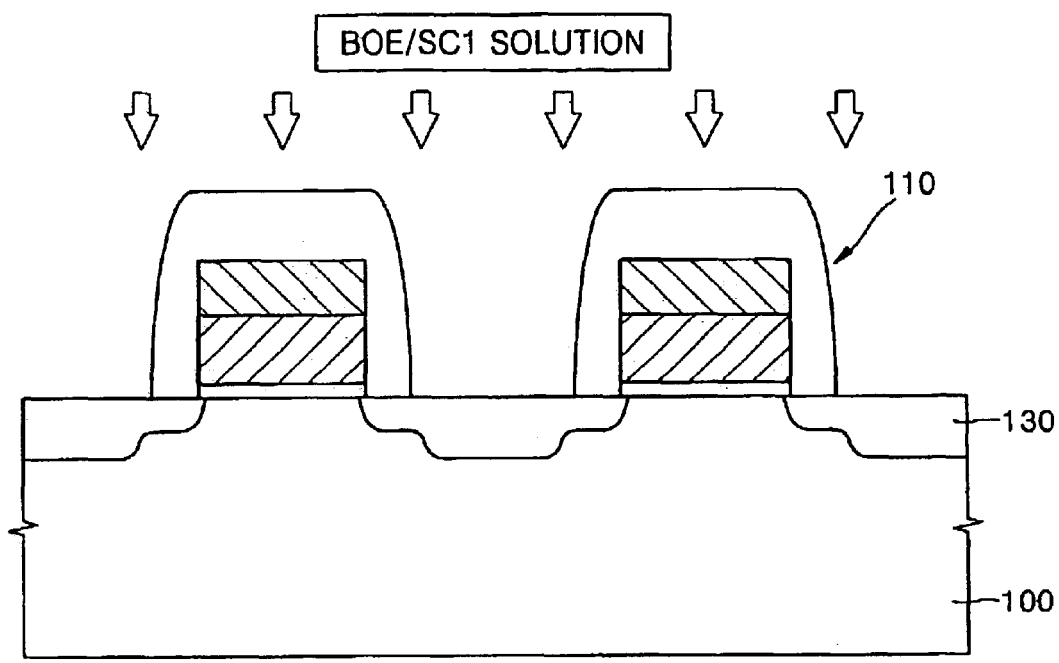
Figure 2D:
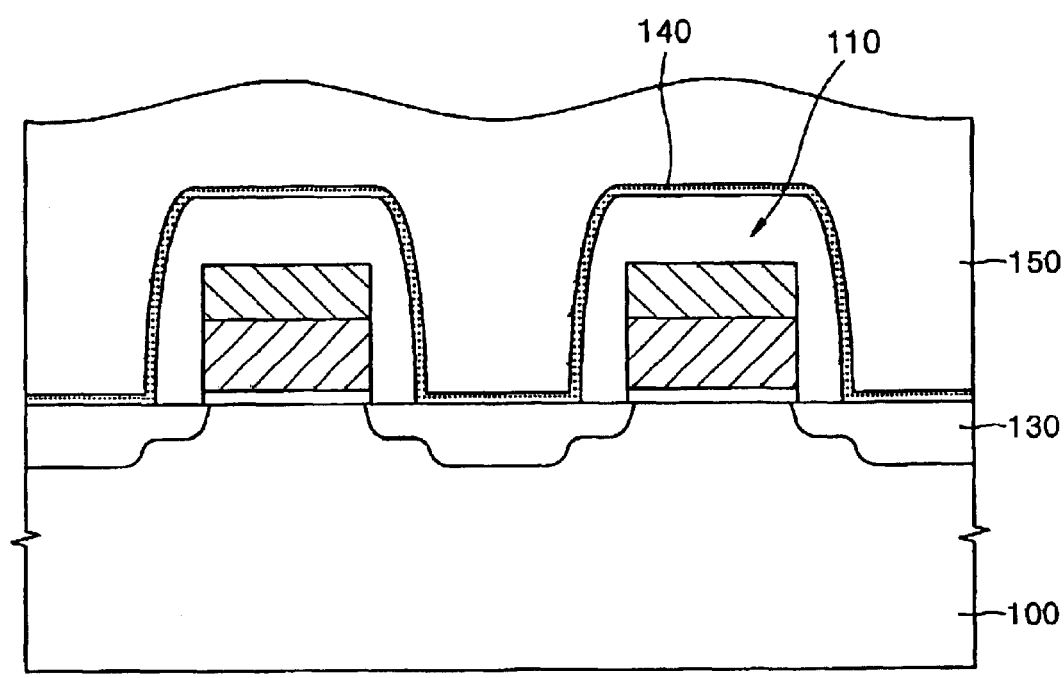

As shown in FIG. 2C, impurity ions implanted into the semiconductor substrate 100 are activated, thereby forming a junction region 130.

Next, a cleaning process is performed to remove residue remaining on the surface of the semiconductor substrate 100 from an etching process. The cleaning process is performed using a solution in which a buffer oxide etchant (BOE) ($HF+NH_4F$) solution is mixed with a standard cleaning 1 (SC1) ($NH_4OH+H_2O_2+H_2O$) solution to remove residue remaining on the surface of the semiconductor substrate 100, and simultaneously to remove the remaining GPOX layer 120. The GPOX layer 120 is very thin. Since the partial thickness of the GPOX layer 120 may be reduced during the cleaning process, such a removal is possible using only the cleaning solution.

Figure 3:
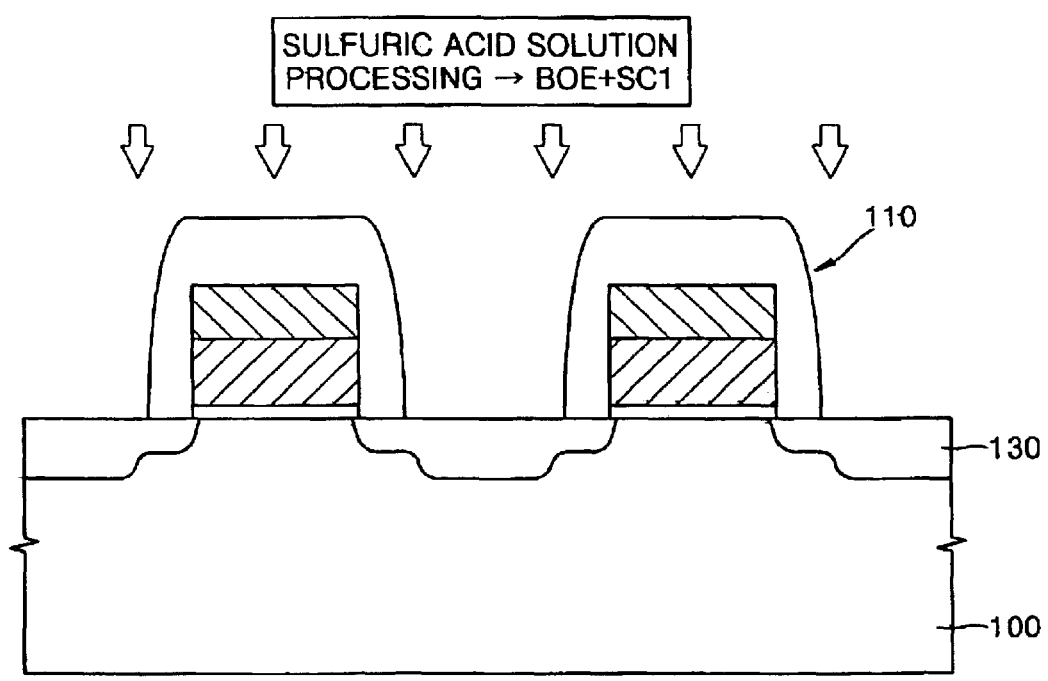

As shown in FIG. 3, before performing the cleaning process using a solution of a BOE solution mixed with a SC1 solution, the surface of the semiconductor substrate 100 may be pre-processed using a sulfuric acid solution at high temperature, for example, a boiling temperature. The residue remaining on the surface of the semiconductor substrate 100 may be more effectively removed by pre-processing using a high temperature sulfuric acid solution.

Referring back to FIG. 2D, an etch stopper 140 formed of silicon nitride ($Si_3N_4$) is formed on the surface of the semiconductor substrate 100, that is, on the surfaces of the gate electrode structure 110 and the junction region 130. Next, a high-density plasma (HDP) oxide layer 150, as an interlayer dielectric (ILD) film, is deposited on the etch stopper 140.

Since formation of a structure of silicon oxide ($SiO_2$) and silicon nitride ($Si_3N_4$) is avoided on the semiconductor substrate 100, bubble defects are prevented around the gate electrode structure 110 when depositing the HDP oxide layer 150.

Further, the GPOX layer 120 smoothes the edges of the gate electrode structure 110, and then is removed after implanting high concentration impurity ions, thereby reducing damage during an ion implantation process.

Further, since the GPOX layer 120 is removed only by a cleaning process, a separate etching process is not required.

(Embodiment 2)

Figure 4A:
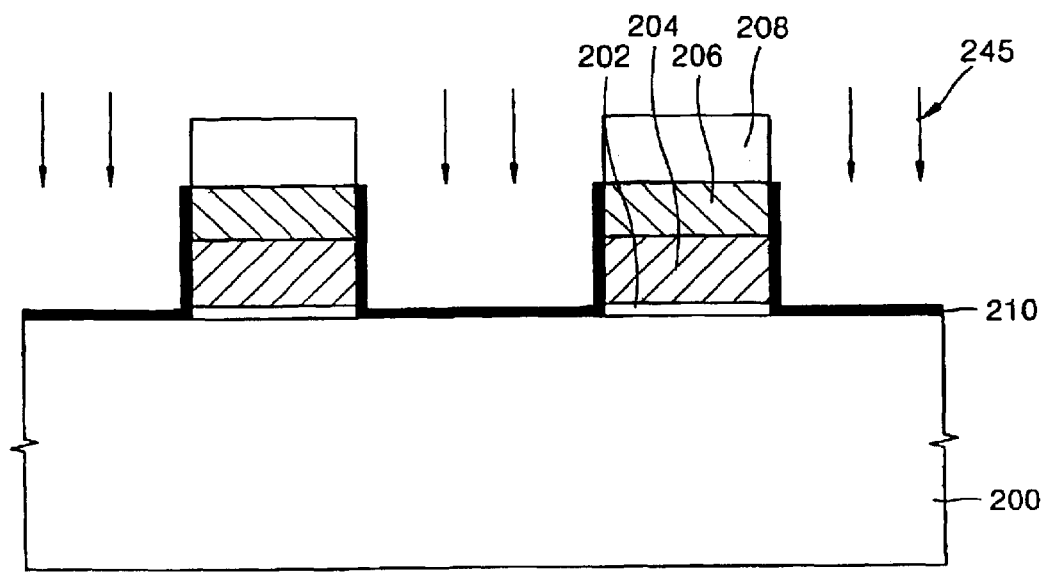
FIGS. 4A through 4D illustrate sectional views of processes according to a second embodiment of the present invention.

FIGS. 4A through 4D illustrate sectional views of processes according to a second embodiment of the present invention. Referring to FIG. 4A, similar to the first embodiment, a gate insulating layer 202, a doped polysilicon layer 204, a metal silicide layer 206, and a capping insulating layer 208 are sequentially stacked on a semiconductor substrate 200, and portions of the layers 202, 204, 206, and 208 are patterned. Next, in order to cure damage caused in the patterning process, the surface of the semiconductor substrate 200 is re-oxidized. An intermediate gate poly oxide (GPOX) layer 210 is formed on the surface of the semiconductor substrate 200 and on both sidewalls of the gate insulating layer 202, the doped polysilicon layer 204, and the metal silicide layer 206, by a re-oxidation process. Since the capping insulating layer 208 is formed of silicon nitride ($Si_3N_4$) or silicon oxynitride (SiON), the intermediate GPOX layer 210 is not formed on the surface and sidewalls of the capping insulating layer 208 during the re-oxidation process. The intermediate GPOX layer 210 is thin, for example, less than 100 Å.

Subsequently, low concentration impurity ions 245 are implanted into the semiconductor substrate 200 at both sides of the patterned capping insulating layer 208, the metal silicide layer 206, and the doped polysilicon layer 204 to form a junction region.

Figure 4B:
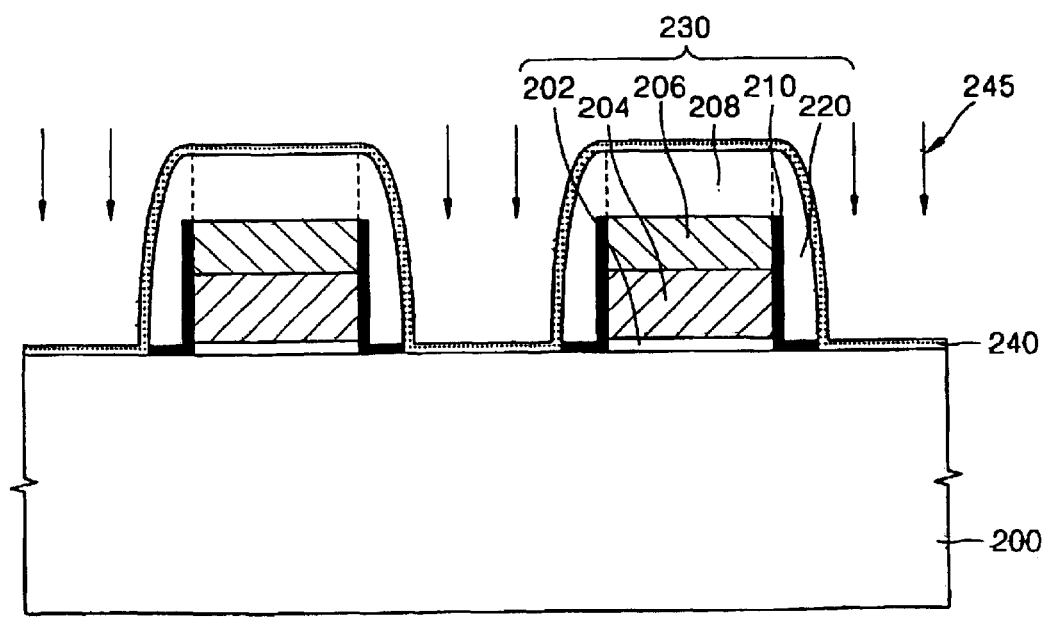

Referring to FIG. 4B, an insulating layer for a spacer (not shown) is deposited on the semiconductor substrate 200. The insulating layer for spacer is anisotropically blanket etched, thereby forming a spacer 220 on both sidewalls of the patterned capping insulating layer 208, the patterned metal silicide layer 206, and the patterned doped polysilicon layer 204. The spacer 220 is formed of the same material as a material for forming the capping insulating layer 208, like in the first embodiment. The intermediate GPOX layer 210 remains between the spacer 220 and the sidewalls of the metal silicide layer 206 and the doped polysilicon layer 204, and between the spacer 220 and the semiconductor substrate 200. Further, the intermediate GPOX layer 210 on other areas of the semiconductor substrate 200 can be partially or completely removed when the spacer 220 is formed. In the second embodiment, a structure including a stack comprised of the gate insulating layer 202, the doped polysilicon layer 204, the metal silicide layer 206, and the capping insulating layer 208, and including the intermediate GPOX layer 210 and the spacer 220 formed on both sidewalls of the stack, is referred to as a gate electrode structure 230.

Next, an outer GPOX layer 240 is formed on the surface of the semiconductor substrate 200 on which the gate electrode structure 230 is formed. The outer GPOX layer 240 is formed to a thickness of less than 100 Å, preferably less than 50 Å.

Impurity ions 245 are implanted into the semiconductor substrate 200 at both sides of the gate electrode structure 230. Since the outer GPOX layer 240 is formed on the surface of the semiconductor substrate 200, damage in the ion implantation process can be reduced.

Figure 4C:
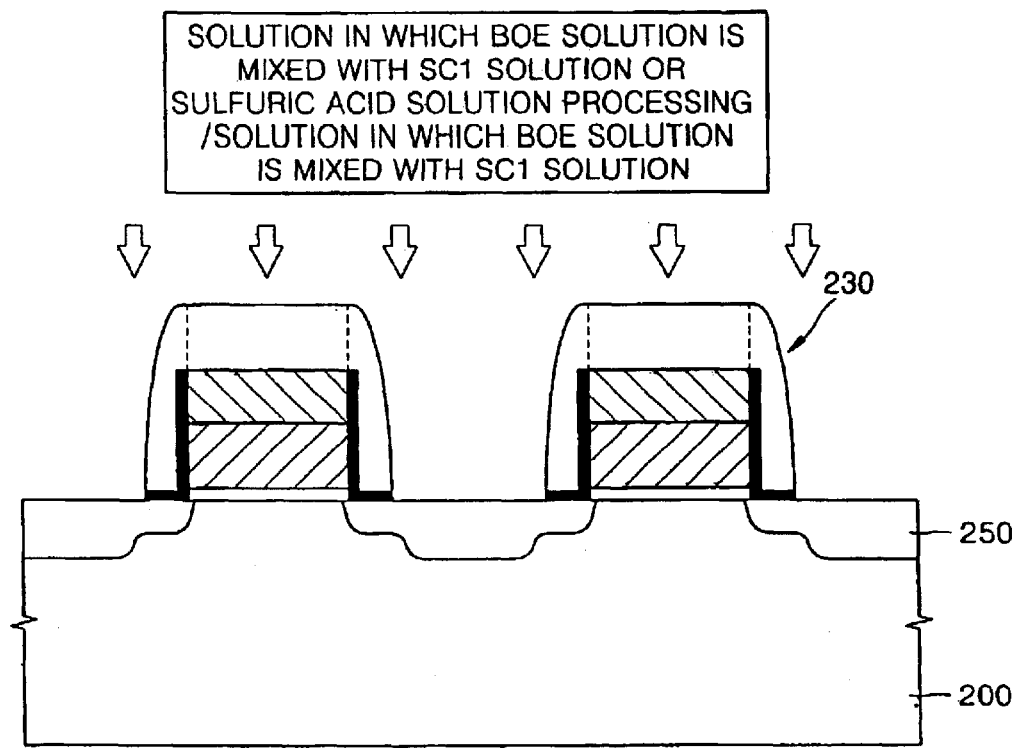

As shown in FIG. 4C, low and high concentration impurity ions implanted to form an ion-implanted junction region are activated, thereby forming a junction region 250.

Referring to FIG. 4C, the semiconductor substrate 200 is cleaned to remove residue from an etching process remaining on the surface of the semiconductor substrate 200, and simultaneously, to remove the outer GPOX layer 240 and the intermediate GPOX layer 210 of which part remains. Like in the first embodiment, a solution in which a buffer oxide etchant (BOE) (HF+$NH_4F$) solution is mixed with a standard cleaning 1 (SC1) ($NH_4OH+H_2O_2+H_2O$) solution, which can minimize effects on other oxide layers on the surface of the semiconductor substrate 200, is used as a cleaning solution. Before performing the cleaning process using the solution in which a BOE solution is mixed with a SC1 solution, the surface of the semiconductor substrate 200 may be pre-processed using a high temperature sulfuric acid solution. The intermediate and outer GPOX layers 210 and 240, and any residue of an etching process, may be simultaneously removed by the cleaning process.

Figure 4D:
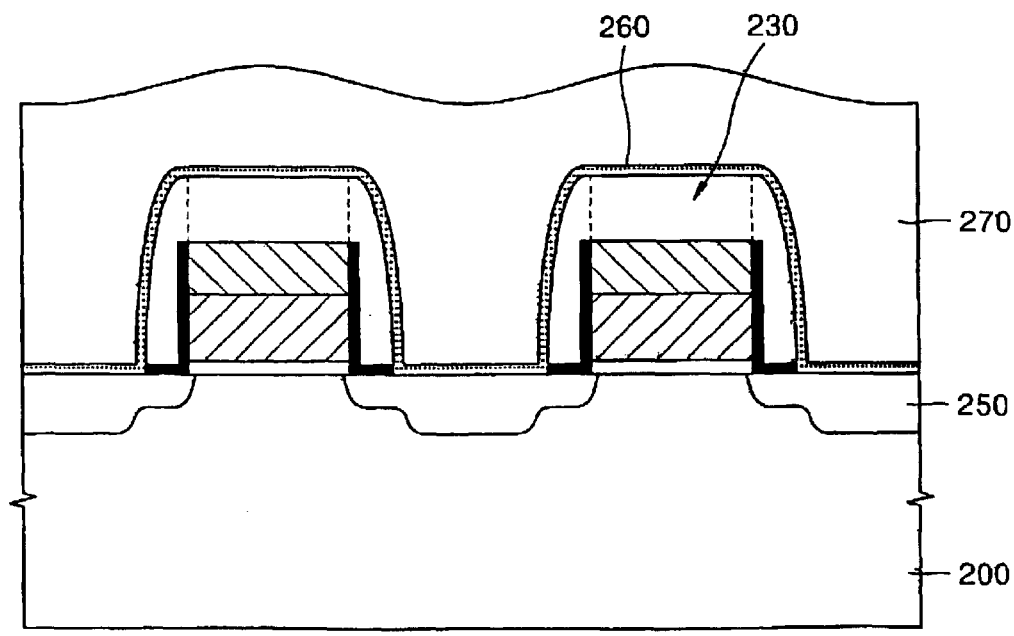

After that, as shown in FIG. 4D, an etch stopper 260 that is formed of silicon nitride ($Si_3N_4$), and a high-density plasma (HDP) oxide layer 270, which is an interlayer dielectric (ILD) film, are deposited on the surface of the resultant of the semiconductor substrate 200.

Since formation of a structure formed of silicon oxide ($SiO_2$) and silicon nitride ($Si_3N_4$) is avoided on the semiconductor substrate 200, except for the sidewalls of the gate electrode structure 230, bubble defects are prevented around the gate electrode structure 230 when depositing the HDP oxide layer 270.

Further, even though sidewall regions of the gate electrode structure 230 are formed of the intermediate GPOX layer 210, formed of silicon oxide ($SiO_2$), and the spacer 220, formed of silicon nitride ($Si_3N_4$), the spacer 220 is thicker than the intermediate GPOX layer 210, thereby preventing bubble defects.

Further, in the second embodiment, damage caused during the etching process to pattern the doped polysilicon layer 204, the metal silicide layer 206, and the capping insulating layer 208 can be cured by forming the intermediate GPOX layer 210.

(Embodiment 3)

Figure 5A:
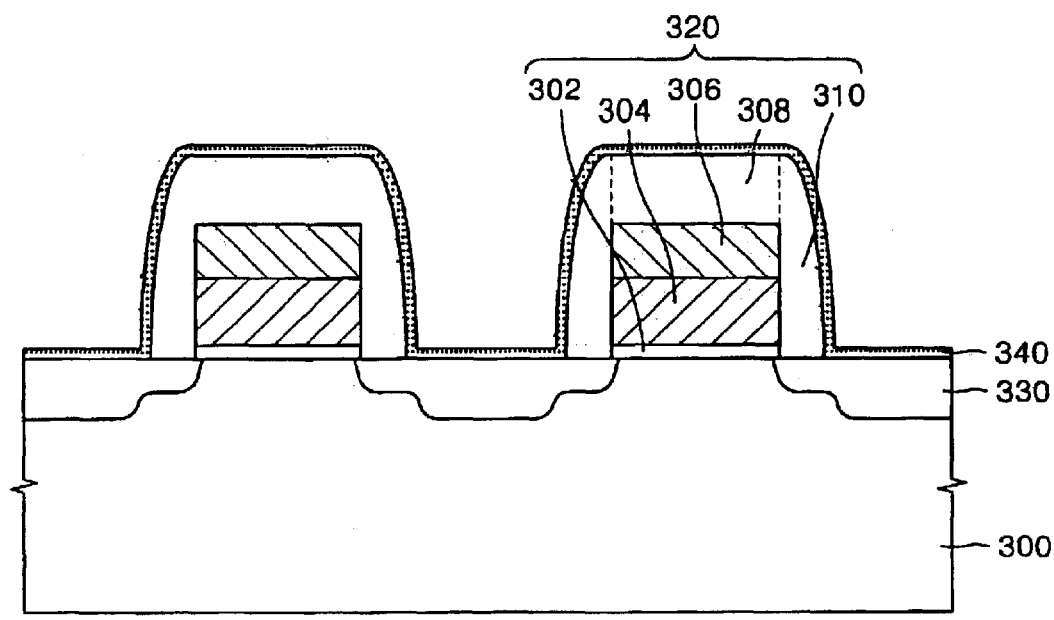
FIGS. 5A and 5B illustrate sectional views of processes according to a third embodiment of the present invention.
Figure 5B:
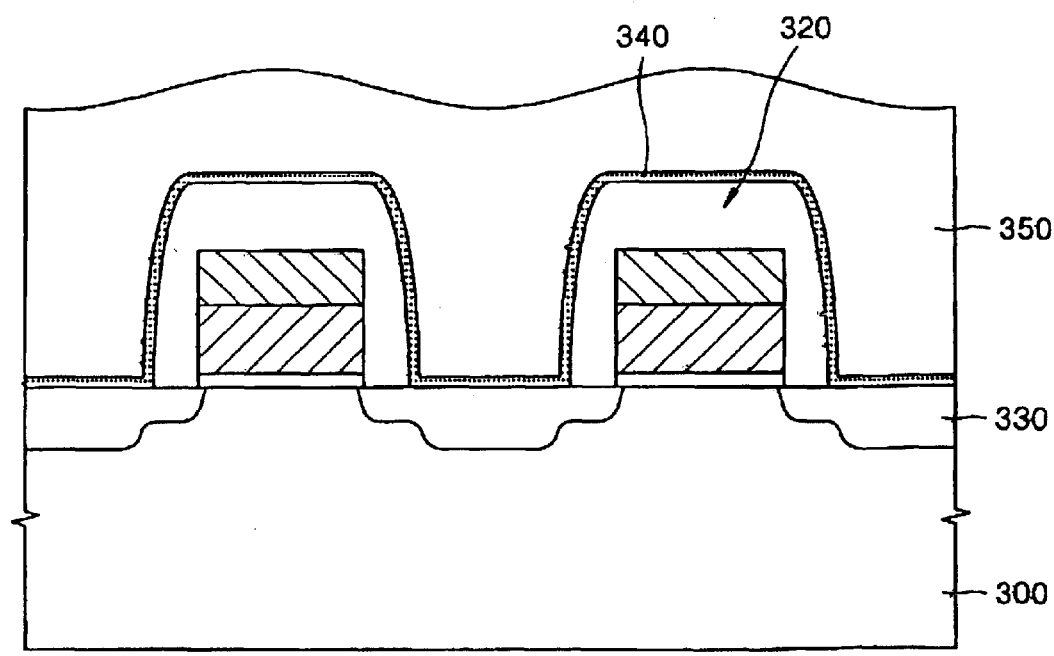

FIGS. 5A and 5B illustrate sectional views of processes according to a third embodiment of the present invention. Referring to FIG. 5A, a gate insulating layer 302, a doped polysilicon layer 304, a metal silicide layer 306, and a capping insulating layer 308 are sequentially stacked on a semiconductor substrate 300, and portions of the layers 302, 304, 306, and 308 are patterned. Subsequently, low concentration impurity ions are implanted into the semiconductor substrate 300 at both sides of the patterned capping insulating layer 308, metal silicide layer 306, and doped polysilicon layer 304 to form a junction region. Next, using a well-known method, a spacer 310 is formed on both sidewalls of the patterned capping insulating layer 308, the patterned metal silicide layer 306, and the patterned doped polysilicon layer 304, thereby forming a gate electrode structure 320. High concentration impurity ions are implanted into the semiconductor substrate 300 at both sides of the gate electrode structure 320, and then, the impurity ions implanted into the semiconductor substrate 300 are activated, thereby forming a junction region 330. An etch stopper 340 preferably formed of silicon nitride ($Si_3N_4$) is then formed on the surface of the semiconductor substrate 300. Before forming the etch stopper 340, the surface of the semiconductor substrate 300 may be cleaned using a high temperature sulfuric acid solution.

Next, as shown in FIG. 5B, a high-density plasma (HDP) oxide layer 350, as an interlayer dielectric (ILD) film, is deposited on the etch stopper 340.

According to the third embodiment, a gate poly oxide (GPOX) layer is not formed, and thus, formation of a structure of silicon oxide (SiO$_2$) and silicon nitride (Si$_3$N$_4$) is avoided on the semiconductor substrate 300 when depositing the HDP oxide layer 350. Therefore, bubble defect problems may be prevented.

(Embodiment 4)

Figure 6A:
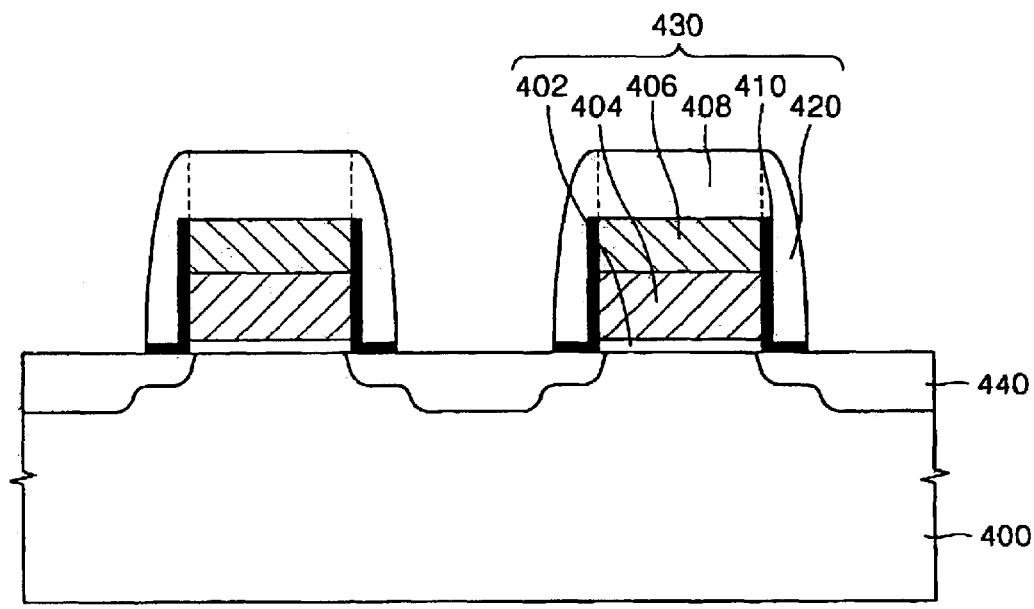
FIGS. 6A and 6B illustrates sectional views of processes according to a fourth embodiment of the present invention.
Figure 6B:
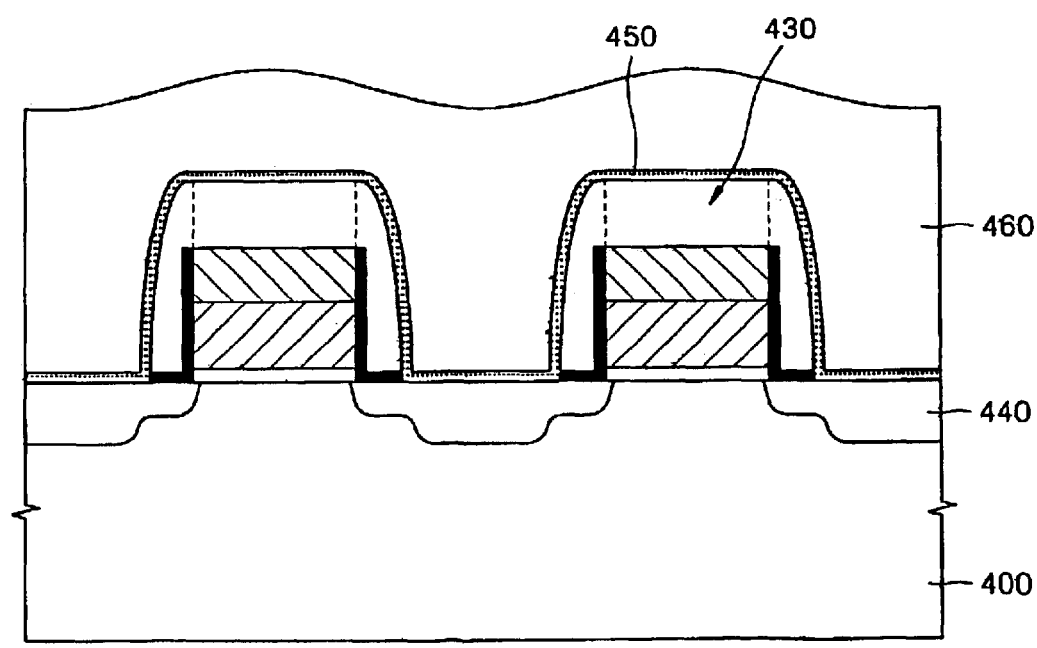

FIGS. 6A and 6B illustrate sectional views of processes according to a fourth embodiment of the present invention. Referring to FIG. 6A, a gate insulating layer 402, a doped polysilicon layer 404, a metal silicide layer 406, and a capping insulating layer 408 are sequentially stacked on a semiconductor substrate 400, and portions of the layers 402, 404, 406, and 408 are patterned. Next, in order to cure damage caused by the patterning process, the surface of the semiconductor substrate 400 is re-oxidized, thereby forming a gate poly oxide (GPOX) layer 410 on the surface of the semiconductor substrate 400 and on both sidewalls of the gate insulating layer 402, the doped polysilicon layer 404, and the metal silicide layer 406. The GPOX layer 410 is thin, for example, less than 100 Å. Subsequently, low concentration impurity ions are implanted into the semiconductor substrate 400 at both sides of the patterned capping insulating layer 408, metal silicide layer 406, and doped polysilicon layer 404 to form a junction region. Next, using a well-known method, a spacer 420 is formed on both sidewalls of the patterned capping insulating layer 408, the patterned metal silicide layer 406, and the patterned doped polysilicon layer 404, thereby forming a gate electrode structure 430 including the gate insulating layer 402, the doped polysilicon layer 404, the metal silicide layer 406, the capping insulating layer 408, the GPOX layer 410, and the spacer 420. Next, high concentration impurity ions are implanted into the semiconductor substrate 400 at both sides of the gate electrode structure 430, thereby forming a junction region 440.

Referring to FIG. 6B, an etch stopper 450 formed of silicon nitride (Si$_3$N$_4$) is formed on the surface of the semiconductor substrate 400, and a high-density plasma (HDP) oxide layer 460, as an interlayer dielectric (ILD) film, is deposited on the etch stopper 450.

Since the step of forming a GPOX layer is not performed after the formation of the gate electrode structure 430 and before the formation of the etch stopper 450, a gate poly oxide (GPOX) layer is not formed, formation of a structure of silicon oxide (SiO$_2$) and silicon nitride (Si$_3$N$_4$) is avoided on the semiconductor substrate 400 when depositing the HDP oxide layer 460. Therefore, bubble defect problems may be prevented.

Further, even though the sidewalls (that is, the spacers) of the gate electrode structure 430 are formed of the GPOX layer 410 formed of silicon oxide (SiO$_2$) and the spacer 420 formed of silicon nitride (Si$_3$N$_4$), the spacer 420 is thicker than the GPOX layer 410, and thus bubble defects do not occur.

The present invention should not be restricted to the first through fourth embodiments. For example, a polysilicon layer doped with an electrode material of the gate electrode structure and a metal silicide layer are preferably used in the first through fourth embodiments, but various conductive layers may be used.

As described above, according to the various embodiments of the present invention, a GPOX layer is either removed by a cleaning process, or is not formed. Therefore, the GPOX layer and the etch stopper are not stacked on the semiconductor substrate when depositing the HDP oxide layer, and thus, bubble defects are prevented, thereby improving electrical properties of a semiconductor device.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:

a semiconductor substrate of a semiconductor material;

a gate electrode structure formed on a surface of the semiconductor substrate;

an etch stopper covering the semiconductor substrate and the gate electrode structure, wherein no intervening layer between the etch stopper and the semiconductor substrate outside the gate electrode structure is of the semiconductor material; and a high-density plasma (HDP) oxide layer formed on the etch stopper.

2. The device as claimed in claim 1, wherein the gate electrode structure includes:

a gate insulating layer formed on the semiconductor substrate;

a conductive layer formed on the gate insulating layer;

a capping insulating layer formed on the conductive layer; and a spacer formed on both sidewalls of the conductive layer and the capping insulating layer.

3. The device as claimed in claim 2, further comprising:

a gate poly oxide (GPOX) layer formed on both sidewalls of the conductive layer and the gate insulating layer, the spacer being between the GPOX layer and the etch stopper.

4. The device as claimed in claim 3, wherein the GPOX layer is formed to a thickness less than 100 Å.

5. The device as claimed in claim 1, wherein the etch stopper is directly on the semiconductor substrate outside the gate electrode region.

6. A semiconductor device, comprising:

a semiconductor substrate;

a gate electrode structure formed on a surface of the semiconductor substrate;

a gate poly oxide (GPOX) layer formed on sidewalls of the gate electrode structure;

an etch stopper covering the semiconductor substrate and the gate electrode structure;

a spacer between the GPOX layer and the etch stopper; and a high-density plasma (HDP) oxide layer formed on the etch stopper.

7. The device as claimed in claim 6, wherein the GPOX layer is formed to a thickness less than 100 Å.

8. The device as claimed in claim 6, wherein the etch stopper is directly on the semiconductor substrate outside the gate electrode region.

* * * * *